United States Patent [19]
Fiedler

[11] Patent Number: 5,659,588
[45] Date of Patent: Aug. 19, 1997

[54] PHASE-LOCKED LOOP HAVING FILTER LEAKAGE CANCELLATION CIRCUIT

[75] Inventor: Alan Fiedler, Minneapolis, Minn.

[73] Assignee: LSI Logic Corporation, Milpitas, Calif.

[21] Appl. No.: 689,905

[22] Filed: Aug. 15, 1996

[51] Int. Cl.$^6$ ................................................. H03D 3/24
[52] U.S. Cl. ............................................................ 375/376
[58] Field of Search ................................ 375/376, 294, 375/215; 455/260; 327/157; 331/1 A, 8, 25

[56] References Cited

U.S. PATENT DOCUMENTS

| | | | |
|---|---|---|---|
| 4,857,866 | 8/1989 | Tateishi | 331/1 A |
| 5,144,156 | 9/1992 | Kawasaki | 307/262 |
| 5,539,344 | 7/1996 | Hatakenaka | 327/147 |

Primary Examiner—Stephen Chin
Assistant Examiner—Betsy L. Deppe
Attorney, Agent, or Firm—Westman, Champlin, & Kelly, P.A.

[57] ABSTRACT

A phase-locked loop includes a phase/frequency detector, a charge pump, a voltage-controlled oscillator and a frequency divider coupled together to form a feedback loop, the feedback loop having a filter node between the charge pump and the voltage-controlled oscillator for coupling to an off-chip loop filter. A first electrostatic discharge (ESD) protection device is coupled to the filter node, which has leakage path through which a leakage current flows. A filter leakage cancellation circuit is coupled to the filter node and includes a second ESD protection device which generates a reference current that is equal to the leakage current. The filter leakage cancellation circuit applies the reference current to the filter node such that the reference current is opposite to and cancels the leakage current.

12 Claims, 3 Drawing Sheets

5,659,588

PHASE-LOCKED LOOP HAVING FILTER LEAKAGE CANCELLATION CIRCUIT

BACKGROUND OF THE INVENTION

The present invention relates to phase-locked loops and, in particular, to a phase-locked loop having a filter leakage cancellation circuit.

Phase-locked loops (PLLs) are used in integrated circuits, such as application specific integrated circuits (ASICs), for clock synchronization and for recovery of serial data streams. A typical PLL includes a phase/frequency detector, a charge pump, a loop filter, a voltage controlled oscillator (VCO) and a frequency divider. The VCO generates a clock signal with a phase and frequency that is a function of the voltage applied to the oscillator. The phase/frequency detector detects a phase difference between the VCO output and the input signal. The phase/frequency detector generates a phase control signal as a function of the difference and applies the phase control signal to the charge pump, which increases or decreases the voltage across the loop filter. This voltage is applied to the VCO for controlling the oscillation frequency and phase.

In many cases, the loop filter cannot be integrated with the PLL on the same integrated circuit, but rather must be implemented with discreet components "off-chip". There are several reasons for implementing the loop filter with discreet components off-chip. For example, a particular application may require tight control of the resistor and capacitor values in the filter, which can be achieved with discrete components. Also, the range of required resistor and capacitor values may be large depending upon the application. In some applications, the capacitor value may be so large that the capacitor would consume excessive on-chip silicon area. Unfortunately, a significant problem results when the loop filter is brought off-chip. The loop filter is coupled to an external pin on the integrated circuit. The integrated circuit typically includes an associated electrostatic discharge (ESD) protection device coupled to the pin, which tends to leak a trickle of current from the filter capacitor. When the PLL has locked on to the phase and frequency of the input signal, the charge leakage from the filter capacitor is restored by the charge pump upon each phase comparison made by the phase/frequency detector, such that the average voltage on the filter capacitor is constant. The frequency of phase comparisons is often a low frequency in the KHz range. The charge leakage from the filter capacitor, followed by the charge restoration at the frequency of the phase comparisons will then show up as problematic signal "spurs" in the VCO's output signal spectrum, which are offset from the VCO's frequency by the phase comparison frequency.

This problem is frequently addressed by using a differential off-chip loop filter. When this is done, and if the leakage on each leg of the differential filter is the same, then the leakage results in only a common-mode shift in the differential filter voltage. A simple feedback circuit is then used to hold the common-mode voltage of the differential filter at a fixed value. The problem with this approach is that the voltage on each leg of the differential filter is typically not the same since it is the difference between these two voltages that controls the VCO frequency. For a low-gain VCO, this difference can be substantial. The different voltages results in different leakage currents off each leg of the filter. A differential signal on the loop filter results, due to the difference in leakage currents. The frequency of this signal, as in the case of the signal-ended filter, is the phase comparison frequency, which again results in problematic signal spurs in the VCO's output signal spectrum. The use of a differential loop filter not only fails to solve the problem, but also results in additional circuit complexity and requires additional inputs and outputs to the integrated circuit.

SUMMARY OF THE INVENTION

The phase-locked loop of the present invention includes a phase/frequency detector, a charge pump, a voltage-controlled oscillator and frequency divider coupled together in series to form a feedback loop. The feedback loop includes a filter node between the charge pump and the voltage-controlled oscillator for coupling to an off-chip loop filter. A first electrostatic discharge (ESD) protection device is coupled to the filter node, which has a leakage path through which a leakage current flows. A filter leakage cancellation circuit is coupled to the filter node for applying a cancellation current to the filter node which is equal and opposite to the leakage current.

In one embodiment, the filter leakage cancellation circuit includes a second ESD protection device and a differential voltage-to-current converter. The second ESD protection device generates a reference leakage current that is substantially equal to the leakage current. The differential voltage-to-current converter includes first and second differential voltage inputs and first and second current outputs. The first voltage input is coupled to the first current output and to the second ESD protection device. The second voltage input and the second current output are coupled to the filter node. The differential voltage-to-current converter sources the reference leakage current on the first current output and through the second ESD protection device. The differential voltage-to-current converter then sources an equal current on the second current output and the filter node, thereby cancelling the leakage current through the first ESD protection device.

DETAILED DESCRIPTION OF THE PREFERRED EMBODIMENTS

Figure 1:
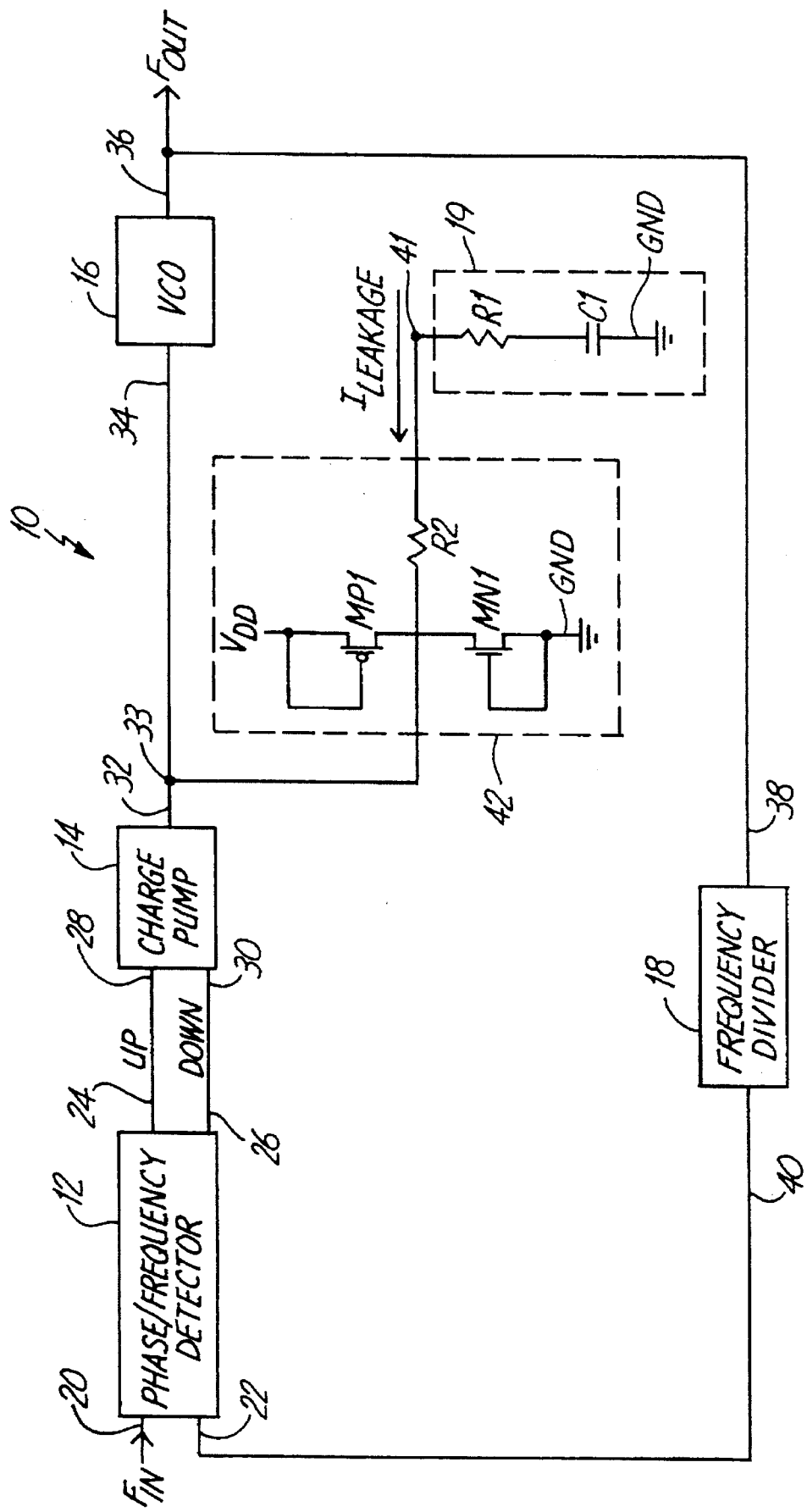
FIG. 1 is a schematic diagram of phase-locked loop having an off-chip loop filter according to the prior art.

FIG. 1 is a schematic diagram of an phase-locked loop (PLL) having an off-chip loop filter according the prior art. PLL 10 is implemented on an integrated circuit and includes phase/frequency detector 12, charge pump 14, voltage-controlled oscillator (VCO) 16, frequency divider 18 and off-chip loop filter 19. Phase/frequency detector 12 has detector inputs 20 and 22 and charge pump control outputs 24 and 26. Outputs 24 and 26 are coupled to inputs 28 and 30 of charge pump 14. Charge pump 14 has an output 32 which is coupled to loop filter node 33 and input 34 of VCO 16. VCO 16 has an output 36 which is coupled to input 38 of frequency divider 18. Frequency divider 18 has an output 40 which is coupled to input 22 of phase/frequency detector 12.

Loop filter 19 is coupled to external pin 41 of the integrated circuit, which is coupled to filter node 33 through electrostatic discharge (ESD) protection device 42. Loop filter 19 includes resistor R1 and capacitor C1 which are coupled together in series between external pin 41 and supply terminal GND. ESD protection device 42 includes N-channel MOSFET MN1, P-channel MOSFET MP1 and resistor R2. N-channel MOSFET MN1 is coupled as a diode between loop filter node 33 and supply terminal GND. P-channel MOSFET MP1 is coupled as diode between supply terminal VDD and loop filter node 33. Resistor R2 is coupled between loop filter node 33 and external pin 41.

During operation, phase/frequency detector 12 detects a phase difference between an input signal $F_{IN}$ applied to detector input 20 and a reference signal applied to detector input 22. Phase/frequency detector 12 generates "up" and "down" signals on outputs 24 and 26 as a function of the difference. The up and down signals are applied to charge pump 14 which causes the charge pump to increase, decrease or not change the voltage on loop filter node 33. VCO 16 receives the voltage on filter node 33 and responsively increases, decreases or does not change it's frequency of oscillation, and thus the frequency of oscillation of output signal $F_{OUT}$. Output signal $F_{OUT}$ is fed back to phase/ frequency detector 12 as the reference signal through frequency divider 18.

After PLL 10 has locked on to the phase and frequency of input signal $F_{IN}$, the integrated circuit's ESD protection device 42 tends to leak a trickle of current $I_{LEAKAGE}$ from filter capacitor C1. The charge leaked from filter capacitor C1 is then restored by charge pump 14 upon each phase comparison made by phase/frequency detector 12 such that the average voltage across filter capacitor C1 remains constant. The charge leakage from capacitor C1, followed by the charge restoration will then show up as problematic signal spurs in the signal spectrum of output signal $F_{OUT}$, which is offset from the VCO's frequency of oscillation by the phase comparison frequency.

Figure 2:
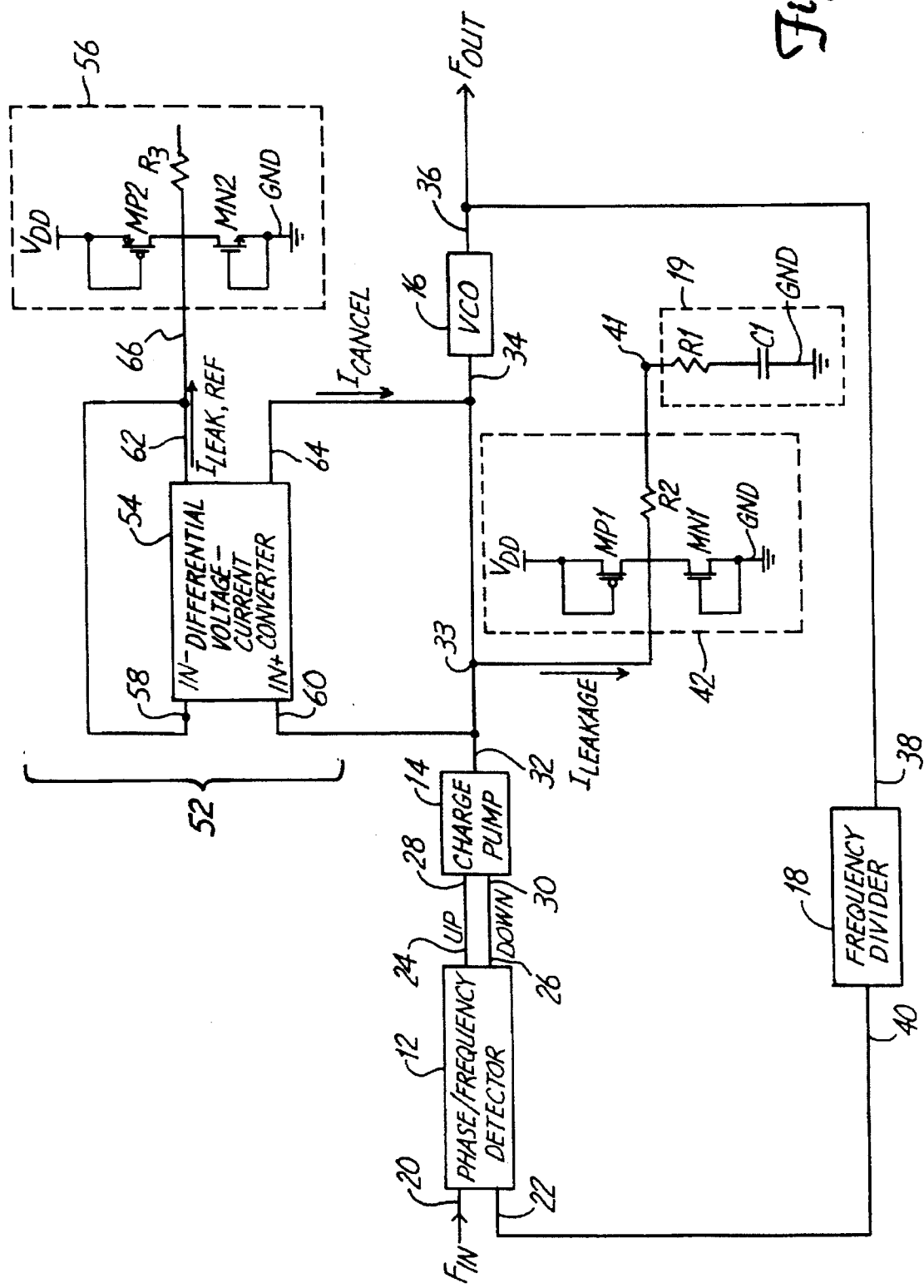
FIG. 2 is a schematic diagram of a phase-locked loop having an off-chip loop filter and a filter leakage cancellation circuit according to the present invention.

FIG. 2 is a schematic diagram of a phase-locked loop 50 according to the present invention. The same reference numerals are used in FIG. 2 as were used in FIG. 1 for the same or similar elements. PLL 50 is similar to PLL 10 shown in FIG. 1, but further includes a filter leakage cancellation circuit 52 coupled to loop filter node 33. Filter leakage cancellation circuit 52 includes differential voltage-to-current converter 54 and reference ESD protection device 56. Differential voltage-to-current converter 54 includes inverting and non-inverting differential voltage inputs 58 and 60 and current outputs 62 and 64. Inverting input 58 is coupled to current output 62 and to input 66 of reference ESD protection device 56. Non-inverting input 60 and current output 64 are coupled to loop filter node 33. In one embodiment, differential voltage-to-current converter 54 is essentially a single gain-stage operation amplifier having a low gain. Reference ESD protection device 56 includes N-channel MOSFET MN2, P-channel MOSFET MP2 and resistor R3. N-channel MOSFET MN2 is coupled as a diode between input terminal 66 and supply terminal GND. P-channel MOSFET MP2 is coupled as a diode between supply terminal VDD and input 66. Resistor R3 has a first terminal coupled to input 66. The second terminal resistor R3 is not connected. In a preferred embodiment, reference ESD protection device 56 is equivalent to ESD protection device 42. The sizes of MOSFETs MN2 and MP2 are equal to the sizes of MOSFETs MN1 and MP1, respectively, and the value of resistor R3 is equal to the value of resistor R1.

Differential voltage-to-current converter 54 senses a voltage difference between voltage input 58 and voltage input 60 and sources a trickle of current ($I_{LEAK,REF}$) as a function of the difference. Differential voltage-to-current converter 54 forces the voltage on output 62 to equal the voltage on input 60. Since reference ESD protection device 56 is equivalent to ESD protection device 42, and since the voltage on output 62 is the same as the voltage on input 60, reference leakage current $I_{LEAK,REF}$ will be substantially equal to leakage current $I_{LEAKAGE}$. The second current output 64 of differential voltage-to-current converter 54 sources a current $I_{CANCEL}$ which is equal to $I_{LEAK,REF}$ onto loop filter node 33, thereby cancelling leakage current $I_{LEAKAGE}$. Cancellation current $I_{CANCEL}$ is equal and opposite to $I_{LEAKAGE}$. The accuracy of the cancellation is principally limited to the matching of the leakage currents through reference ESD protection device 56 and ESD protection device 42, and the matching of currents from the two current outputs of the differential voltage-to-current converter 54.

Figure 3:
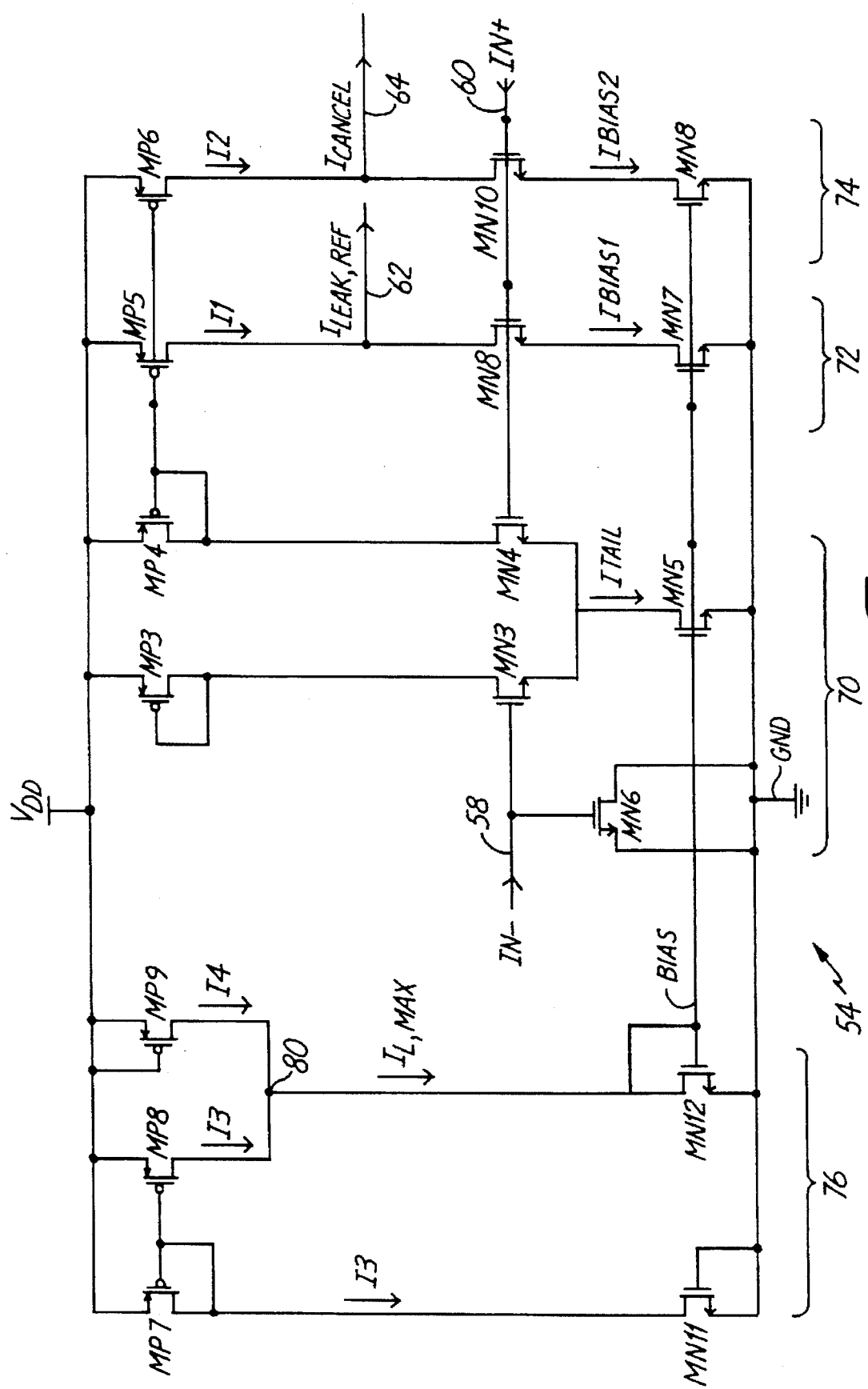
FIG. 3 is a schematic diagram of a differential voltage-to-current converter used in the phase-locked loop shown in FIG. 2.

FIG. 3 is a schematic diagram which illustrates differential voltage-to-current 54 in greater detail. Differential voltage-to-current converter 54 includes differential input stage 70, output stages 72 and 74 and current bias generator 76. Differential input stage 70 includes inverting and non-inverting differential voltage inputs 58 and 60, N-channel MOSFETs MN3–MN6 and P-channel MOSFETs MP3 and MP4. N-channel MOSFET MN3 has a gate coupled to inverting input 58, a source coupled to the drain of N-channel MOSFET MN5 and a drain coupled to the gate and drain of MOSFET MP3. N-channel MOSFET MN4 has a gate coupled to non-inverting input 60, a source coupled to the drain of N-channel MOSFET MN5 and a drain coupled to the gate and drain of P-channel MOSFET MP4. N-channel MOSFET MN5 has a gate coupled to bias node BIAS and a source coupled to supply terminal GND. P-channel MOSFETs MP3 and MP4 have their sources coupled to supply terminal VDD.

N-channel MOSFET MN5 is a tail current source which sources a tail current $I_{TAIL}$ as a function of the voltage on bias node BIAS. N-channel MOSFETS MN3 and MN4 are current steering transistors which direct tail current $I_{TAIL}$ through P-channel MOSFETs MP3 and MP4 as a function of the voltages on inverting and non-inverting inputs 58 and 60. N-channel MOSFET MN6 filters the voltage on input 58.

Output stage 72 includes N-channel MOSFETS MN7 and MN8 and P-channel MOSFET MP5. N-channel MOSFET MN7 has a gate coupled to bias node BIAS, a source coupled to supply terminal GND and drain coupled to the source of N-channel MOSFET MN8. N-channel MOSFET MN7 sources an output bias current $I_{BIAS1}$ at its drain. N-channel MOSFET MN8 is a bias transistor which has a gate coupled to non-inverting input 60 and a drain coupled to current output 62. P-channel MOSFET MP5 has a gate coupled to the gate and drain of P-channel MOSFET MP4, a source coupled to supply terminal VDD and a drain coupled to current output 62. P-channel MOSFETs MP4 and MP5 together form a current mirror which mirrors the current flowing through the drain of P-channel MOSFET MP4 into the drain of P-channel MOSFET MP5, as current I1.

Output stage 74 includes N-channel MOSFETS MN9 and MN10 and P-channel MOSFET MP6. N-channel MOSFET MN9 has a gate coupled to bias node BIAS, a source coupled to supply terminal GND and drain coupled to the source of N-channel MOSFET MN10. N-Channel MOSFET MN9 sources an output bias current $I_{BIAS2}$ at its drain. N-channel MOSFET MN10 is a bias transistor which has a gate coupled to non-inverting input 60 and a drain coupled to current output 64. P-channel MOSFET MP6 has a gate coupled to the gate and drain of P-channel MOSFET MP4, a source coupled to supply terminal VDD and a drain coupled to current output 64. P-channel MOSFETs MP4 and MP6 together form a current mirror which mirrors the current flowing through the drain of P-channel MOSFET MP4 into the drain of P-channel MOSFET MP6, as current I2.

N-channel MOSFETs MN8 and MN10 reduce the offset of converter 54 by forcing the drain voltages of N-channel MOSFETs MN7 and MN9 equal to the drain voltage of N-channel MOSFET MN5. N-channel bias MOSFETs MN8 and MN10 are optional.

Current bias generator 76 includes N-channel MOSFETs MN11 and MN12 and P-channel MOSFETs MP7, MP8 and MP9. N-channel MOSFET MN11 has a gate and a source coupled to supply terminal GND and a drain coupled to the gate and drain of P-channel MOSFET MP7. P-channel MOSFET MP7 has a source coupled to supply terminal VDD. P-channel MOSFET MP8 has a gate coupled to the gate and drain of N-channel MOSFET MP7, a source coupled to supply terminal VDD and a drain coupled to the drain of P-channel MOSFET MP9 and the gate and drain of N-channel MOSFET MN12. P-channel MOSFET MP9 has a gate, source coupled to supply terminal VDD. N-channel MOSFET MN12 has a source coupled to ground terminal GND. The gate and drain of N-channel MOSFET MN12 forms bias node BIAS.

Current bias generator 76 generates a bias current $I_{L,MAX}$ which represents the maximum current that differential voltage-to-current converter 54 will be expected to source or sink to cancel the leakage current in ESD protection device 42 through current outputs 62 and 64. N-channel MOSFET MN11 is coupled as a diode and has a gate width which is one-half of the gate widths of N-channel MOSFETs MN1 and MN2. P-channel MOSFETs MP7 and MP8 form a current mirror which mirrors current I3 into the drain of P-channel MOSFET MP8. P-channel MOSFET MP9 has a gate width which is one-half of the gate widths of P-channel MOSFETs MP1 and MP2. Currents I3 and I4 are summed at node 80. Current $I_{L,MAX}$ is thus the sum of one-half of the maximum leakage currents expected from N-channel MOSFETs MN1 and MN2 and P-channel MOSFETs MP1 and MP2.

N-channel MOSFET MN12 mirrors the maximum current $I_{L,MAX}$ into the drains of N-channel MOSFETs MN5, MN7 and MN9. However, the gate widths of N-channel MOSFETs MN12, MN5, MN7 and MN9 have ratios that are selected such that tail current $I_{TAIL}$ and bias currents $I_{BIAS1}$ and $I_{BIAS2}$ have very low values, about eight times and four times, respectively, of the maximum current $I_{L,MAX}$. N-channel MOSFET MN12 has a gate width W1. N-channel MOSFET MN5 has a gate width $8W_1$. N-channel MOSFETs MN7 and MN9 each have a gate width $4W_1$. P-channel MOSFET MP3, MP4, MP5, and MP6 each have a gate width $W_2$. By limiting the operating current of the circuit to this low level, circuit stability is easily achieved when combined with a small filter capacitor MN6, and good matching of the net output currents $I_{LEAK,REF}$ and $I_{CANCEL}$ on outputs 62 and 64 is also achieved.

Although the present invention has been described with reference to preferred embodiments, workers skilled in the art will recognize that changes may be made in form and detail without departing from the spirit and scope of the invention. For example, although the present invention has been described with reference to a particular differential voltage-to-current converter, other converters or current mirrors can also be used with the present invention. The present invention can be implemented with various technologies other than MOS technology. The voltage supply terminals can be relatively positive or relatively negative, depending upon the particular convention adopted and the technology used. The terms "pull-up" and "pull-down" used in the specification and the claims are arbitrary terms and can refer to either a logic high level or a logic low level, depending upon the relative levels of the voltage supply terminals. Likewise, the term "coupled" can include various types of connections or couplings and can include a direct connection or a connection through one or more intermediate components.

What is claimed is:

1. A phase-locked loop comprising:

a phase/frequency detector, a charge pump, a voltage-controlled oscillator and a frequency divider coupled together in series to form a feedback loop, the feedback loop having a filter node between the charge pump and the voltage-controlled oscillator for coupling to an off-chip loop filter;

a first electrostatic discharge (ESD) protection device coupled to the filter node, which has a leakage path through which a leakage current flows;

a second ESD protection device which generates a reference leakage current that is equal to the leakage current; and a filter leakage cancellation circuit coupled to the filter node and to the second ESD protection device, wherein the filter leakage cancellation circuit receives the reference leakage current, generates a cancellation current that is equal to the reference leakage current and applies the cancellation current to the filter node such that the cancellation current is opposite to and cancels the leakage current.

2. The phase-locked loop of claim 1 wherein the filter leakage cancellation circuit further comprises:

a differential voltage-to-current converter comprising non-inverting and inverting inputs and first and second current outputs which source current when the non-inverting input is more positive than the inverting input and sink current when the non-inverting input is less positive than the inverting input, wherein the inverting input is coupled to the first current output, the non-inverting input is coupled to the filter node and the second current output is coupled to the filter node.

3. The phase-locked loop of claim 2 wherein the differential voltage-to-current converter further comprises:

a differential input stage coupled to the non-inverting and inverting inputs and having a tail current source and an output;

a first output stage comprising a first current mirror coupled between the output of the differential input stage and the first current output and comprising a first output current source; and a second output stage comprising a second current mirror coupled between the output of the differential input stage and the second current output and comprising a second output current source.

4. The phase-locked loop of claim 3 wherein the second ESD protection device has a maximum leakage current and wherein the tail current source is biased to source eight times the maximum leakage current and the first and second output current sources are each biased to source four times the maximum leakage current.

5. The phase-locked loop of claim 3 wherein the differential voltage-to-current converter further comprises a current bias generator which comprises:

first and second supply terminals;

a first transistor having a gate and source coupled to the second supply terminal and having a drain;

a second transistor having a gate and source coupled to the first supply terminal and having a drain;

a current mirror having an input coupled to the drain of the first transistor and an output coupled to the drain of the second transistor;

a third transistor having a gate and drain coupled to the drain of the second transistor and a source coupled to the second supply terminal, wherein the gate of the third transistor forms a current bias node; and wherein the tail current source and the first and second output current sources each comprise a transistor having a gate coupled to the current bias node.

6. The phase-locked loop of claim 5 wherein:

the first and second ESD protection devices each comprise a diode-connected PMOS transistor and a diode-connected NMOS transistor which are coupled in series between the first and second supply terminals and which have a gate width; and the first transistor of the current bias generator comprises an NMOS transistor having a gate width which is one-half of the gate width of the NMOS transistors in the first and second ESD protection devices; and the second transistor of the current bias generator comprises a PMOS transistor having a gate width which is one-half of the gate width of the PMOS transistors in the first and second ESD protection devices.

7. The phase-locked loop of claim 5 wherein:

the third transistor in the current bias generator has a gate width;

the transistor in the tail current source has a gate width which is eight times the gate width of the third transistor in the current bias generator;

the transistor in first output current source has a gate width which is four times the gate width of the third transistor in the current bias generator; and the transistor in second output current source has a gate width which is four times the gate width of the third transistor in the current bias generator.

8. An integrated circuit comprising:

a phase-locked loop comprising a phase/frequency detector, a charge pump, a voltage-controlled oscillator and a frequency divider coupled together in series and having a filter node between the charge pump and the voltage-controlled oscillator;

an external pin for coupling to an off-chip loop filter;

a first electrostatic discharge (ESD) protection device coupled between the external pin and the filter node, which has a leakage path through which a leakage current flows; and means coupled to the filter node for applying a cancellation current to the filter node which is equal and opposite to the leakage current.

9. The phase-locked loop of claim 8 wherein the means for applying comprises:

a second ESD protection device which generates a reference leakage current that is equal to the leakage current; and a differential voltage-to-current converter comprising inverting and non-inverting inputs and first and second current outputs, wherein the inverting input is coupled to the first current output and to the second ESD protection device, the non-inverting input is coupled to the filter node and the second current output is coupled to the filter node.

10. An integrated circuit comprising:

a plurality of external pins;

a phase/frequency detector, a charge pump, a voltage-controlled oscillator and a frequency divider coupled together in series to form a phase-locked loop, the phase-locked loop having a filter node between the charge pump and the voltage-controlled oscillator;

a first electrostatic discharge (ESD) protection device coupled between one of the plurality of external pins and the filter node, which has a leakage path through which a leakage current flows;

a second ESD protection device which generates a reference leakage current that is equal to the leakage current; and a cancellation circuit coupled between the second ESD protection device and the filter node which applies a cancellation current to the filter node in response to the reference leakage current to cancel the leakage current.

11. A method of reducing leakage current from a loop filter in a phase-locked loop, the phase-locked loop having a first electrostatic protection device (ESD) coupled to the loop filter which generates the leakage current, the method comprising:

generating a reference leakage current with a reference ESD protection device; and applying a cancellation current, which is equal to the reference leakage current, to the loop filter such that the cancellation current cancels the leakage current.

12. The method of claim 11 wherein the step of generating comprises generating a reference leakage current that is equal to the leakage current and mirroring the reference leakage current onto the loop filter as the cancellation current, which is equal and opposite to the leakage current.

* * * * *